United States Patent [19]

Wester

[11] 4,081,022
[45] Mar. 28, 1978

[54] THERMOSTAT SUBSTITUTION CIRCUIT DEVICE

[75] Inventor: Sanfrid J. Wester, Huntsville, Ala.

[73] Assignee: The Raymond Lee Organization, Inc., New York, N.Y. ; a part interest

[21] Appl. No.: 736,201

[22] Filed: Oct. 27, 1976

[51] Int. Cl.² ............................................ H01H 41/00
[52] U.S. Cl. ..................................... 165/11; 307/114; 307/115; 324/73 R
[58] Field of Search ........................... 165/11; 324/73; 307/112, 114, 115

[56] References Cited

U.S. PATENT DOCUMENTS

| 2,778,957 | 1/1957 | Fuchs | 307/112 |
| 2,835,830 | 5/1958 | Rathenau | 307/112 |
| 2,988,655 | 6/1961 | Rudolph et al. | 307/114 |

*Primary Examiner*—Albert W. Davis, Jr.
*Attorney, Agent, or Firm*—Daniel Jay Tick

[57] ABSTRACT

First and second wafer switches are provided in a housing. Each of the switches has a control member outside the housing for manual operation and a plurality of electrical contacts inside the housing. Selected contacts of the first wafer switch are electrically connected to a cable for independent electrical connection to first and second stage cooling lines, a fan, a source of voltage and first and second stage heating lines. Selected contacts of the second wafer switch are electrically connected to a pair of test leads and are electrically connected to a cable for independent electrical connection to defrost checking circuits. Selected contacts of the first and second wafer switches are connected to each other. A user substitutes thermostatic operation by selective operation of the control members of the first and second wafer switches after connection of the leads and the leads of the cables to the corresponding lines and circuits.

1 Claim, 2 Drawing Figures

THERMOSTAT SUBSTITUTION CIRCUIT DEVICE

BACKGROUND OF THE INVENTION

The present invention relates to a thermostat substitution circuit device. More particularly, the invention relates to a thermostat substitution circuit device for substituting a thermostat in testing of heating and cooling system circuitry.

At the present time, in order for a heating and/or cooling system to be tested for malfunction, or proper adjustment, two men must work together. One man, who is at the source of the necessary equipment and/or circuitry, must continually communicate by shouting with the other man who is at the thermostat and varies or adjusts the thermostat in accordance with the necessities of the testing operations.

Objects of the invention are to provide a thermostat substitution circuit device of simple structure, which is inexpensive in manufacture, used with facility and convenience, and avoids the necessity for using two men when making the necessary adjustments to the thermostat, one of whom must make adjustments to the thermostat, while the other makes the electrical connections and variations, thereby permitting a single man to do all the necessary circuit and thermostat testing work in a heating and/or cooling system and saving, beside the cost of labor of two men, considerable time and effort.

BRIEF DESCRIPTION OF THE DRAWING

In order that the invention may be readily carried into effect, it will now be described with reference to the accompanying drawings, wherein.

DETAILED DESCRIPTION OF THE INVENTION

The thermostat substitution circuit device of the invention is a substitute circuit for the thermostat and thereby avoids the necessity for having a man available at the thermostat to vary said thermostat in accordance with the wishes of a second man testing the actual equipment and/or circuitry of the heating and/or cooling system of which the thermostat is a part. The thermostat substitution circuit device of the invention thus substitutes for a thermostat in the testing of heating and cooling system circuitry.

Figure 2:
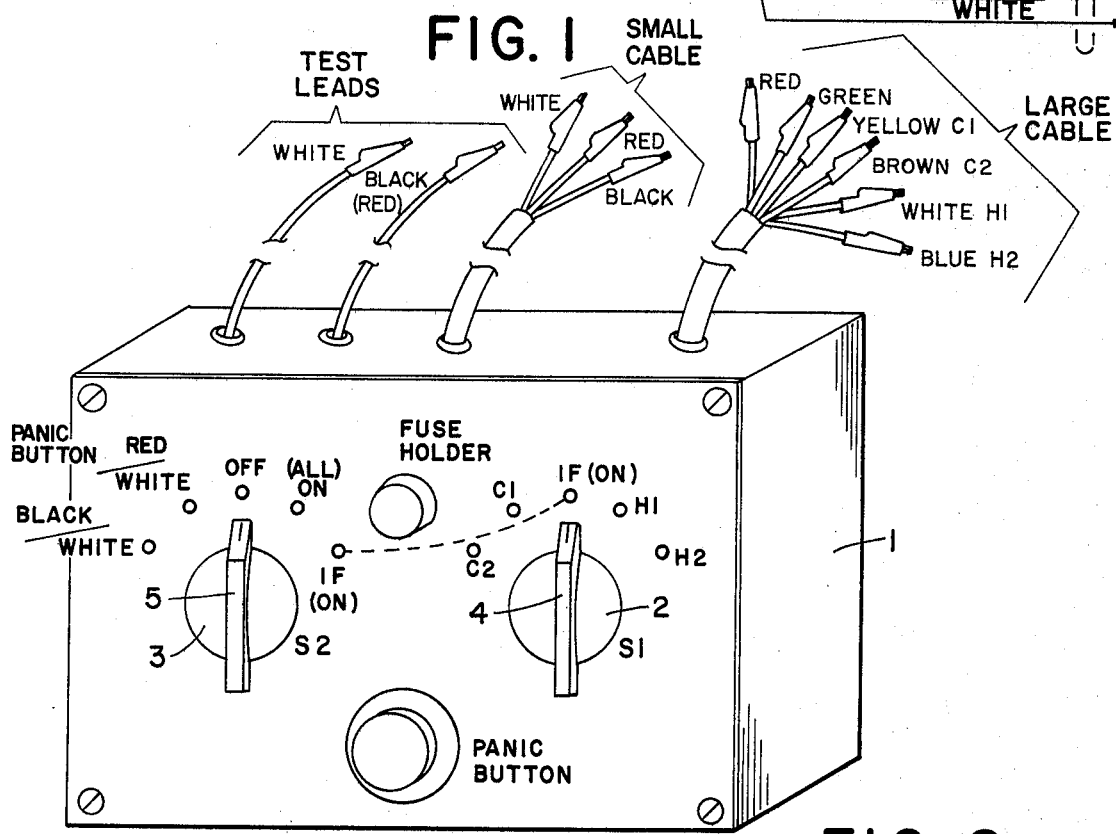
FIG. 2 is a view of an embodiment of the housing of the thermostat substitution circuit device of the invention.

The thermostat substitution circuit device of the invention comprises a housing 1 (FIG. 2).

First and second wafer switches 2 and 3 are provided in the housing 1. The first and second wafer switches 2 and 3 have control members 4 and 5, respectively (FIG. 2), outside the housing for manual operation.

Figure 1:
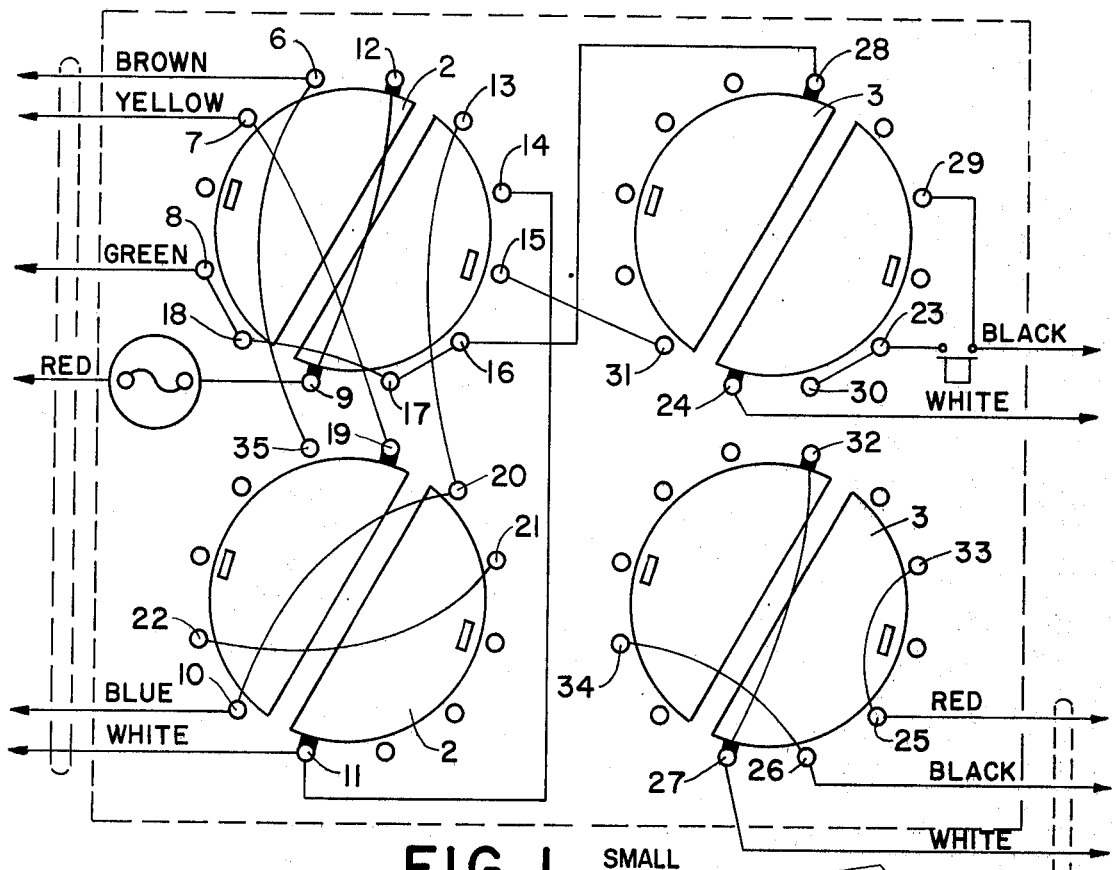
FIG. 1 is a circuit diagram of an embodiment of the thermostat substitution circuit device of the invention.

Each of the first and second wafer switches 2 and 3 has a plurality of electrical contacts in the housing 1. Thus, as shown in FIG. 1, the first wafer switch 2 has contacts 6 and 7 electrically connected to a cable for independent electrical connection to first and second cooling stage lines, a contact 8 electrically connected to a fan, a contact 9 electrically connected to a source of voltage, and contacts 10 and 11 electrically connected to first and second stage heating lines. The first wafer switch 2 has additional electrical contacts 12, 13, 14, 15, 16, 17, 18, 19, 20, 21 and 22.

The second wafer switch 3 has electrical contacts 23 and 24 electrically connected to a pair of test leads and electrical contacts 25, 26 and 27 electrically connected to a cable for independent electrical connection to defrost checking circuits. The second wafer switch 3 also has electrical contacts 28, 29, 30, 31, 32, 33 and 34.

The electrical contacts 15 and 16 of the first wafer switch 2 are electrically connected to the electrical contacts 31 and 28, respectively, of the second wafer switch 3. In the wafer switch 2, the electrical contacts 8, 18, 17 and 16 are electrically connected to each other. The electrical contacts 6 and 35 are electrically connected to each other. The electrical contacts 7 and 19 are electrically connected to each other. The electrical contacts 12 and 9 are electrically connected to each other. The electrical contacts 13, 20 and 10 are electrically connected to each other. The electrical contacts 21 and 22 are electrically connected to each other. The electrical contacts 11 and 14 are electrically connected to each other.

The electrical contacts 23 and 30 are electrically connected to each other. The electrical contacts 32 and 27 are electrically connected to each other. The electrical contacts 34 and 26 are electrically connected to each other. The electrical contacts 33 and 25 are electrically connected to each other.

A user substitutes thermostatic operation by selective operation of the control members 4 and 5 of the first and second wafer switches 2 and 3 after connection of the leads and the leads of the cables to the corresponding lines and circuits.

While the invention has been described by means of a specific example and in a specific embodiment, I do not wish to be limited thereto, for obvious modifications will occur to those skilled in the art without departing from the spirit and scope of the invention.

I claim:

1. A thermostat substitution circuit device for substituting for a thermostat in testing of heating and cooling system circuitry, said thermostat substitution circuit device comprising a housing; and first and second wafer switches in the housing, each having a control member outside the housing for manual operation and a plurality of electrical contacts inside the housing, selected contacts of the first wafer switch being electrically connected to a cable for independent electrical connection to first and second stage cooling lines, a fan, a source of voltage and first and second stage heating lines, selected contacts of the second wafer switch being electrically connected to a pair of test leads and being electrically connected to a cable for independent electrical connection to defrost checking circuits, selected contacts of the first and second wafer switches being connected to each other whereby a user substitutes thermostatic operation by selective operation of the control members of the first and second wafer switches after connection of the leads and the leads of the cables to the corresponding lines and circuits.

* * * * *